United States Patent
Saito et al.

(10) Patent No.: US 10,654,744 B2
(45) Date of Patent: May 19, 2020

(54) GLASS

(71) Applicant: Nippon Electric Glass Co., Ltd., Shiga (JP)

(72) Inventors: Atsuki Saito, Shiga (JP); Masahiro Hayashi, Shiga (JP)

(73) Assignee: NIPPON ELECTRIC GLASS CO., LTD., Shiga (JP)

( * ) Notice: Subject to any disclaimer, the term of this patent is extended or adjusted under 35 U.S.C. 154(b) by 0 days.

(21) Appl. No.: 16/069,248

(22) PCT Filed: Jan. 5, 2017

(86) PCT No.: PCT/JP2017/000163
§ 371 (c)(1),
(2) Date: Jul. 11, 2018

(87) PCT Pub. No.: WO2017/122576
PCT Pub. Date: Jul. 20, 2017

(65) Prior Publication Data
US 2019/0016626 A1    Jan. 17, 2019

(30) Foreign Application Priority Data

Jan. 12, 2016  (JP) ................................ 2016-003222
Sep. 27, 2016  (JP) ................................ 2016-187716

(51) Int. Cl.
| | | |
|---|---|---|
| *C03C 3/097* | (2006.01) | |
| *H01L 29/786* | (2006.01) | |
| *H01L 21/02* | (2006.01) | |
| *H01L 27/12* | (2006.01) | |
| *H01L 33/00* | (2010.01) | |
| *H01L 33/32* | (2010.01) | |

(52) U.S. Cl.
CPC ........ *C03C 3/097* (2013.01); *H01L 21/02422* (2013.01); *H01L 27/1218* (2013.01); *H01L 29/78603* (2013.01); *H01L 27/1222* (2013.01); *H01L 27/1225* (2013.01); *H01L 29/7869* (2013.01); *H01L 29/78672* (2013.01); *H01L 33/007* (2013.01); *H01L 33/0066* (2013.01); *H01L 33/32* (2013.01)

(58) Field of Classification Search
CPC .......... C03C 3/095; C03C 3/085; C03C 3/087
See application file for complete search history.

(56) References Cited

U.S. PATENT DOCUMENTS

| | | | |
|---|---|---|---|
| 2014/0049708 A1* | 2/2014 | Murata | ................... C03C 3/087 349/15 |
| 2014/0335331 A1 | 11/2014 | Eillison et al. | |
| 2015/0210583 A1 | 7/2015 | Amosov et al. | |
| 2016/0347639 A1 | 12/2016 | Hu et al. | |
| 2018/0148367 A1* | 5/2018 | Hayashi | ................ G02F 1/1333 |

FOREIGN PATENT DOCUMENTS

| | | |
|---|---|---|
| JP | 57-191251 | 11/1982 |
| JP | 1-126239 | 5/1989 |
| JP | 11-243229 | 9/1999 |
| WO | 2014/182753 | 11/2014 |

OTHER PUBLICATIONS

Machine Translation of JP 57-191251 A, Yamamoto, 1982. (Year: 1982).*
Machine Translation of JP H01-126239A, Sunada et al., 1989. (Year: 1989).*
Priority Document JP 2016-187716, Sep. 27, 2016 (Year: 2016).*
International Preliminary Report on Patentability dated Jul. 17, 2018 in International Application No. PCT/JP2017/000163.
International Search Report dated Apr. 11, 2017 in International Application No. PCT/JP2017/000163.

* cited by examiner

*Primary Examiner* — Elizabeth A. Bolden
(74) *Attorney, Agent, or Firm* — Wenderoth, Lind & Ponack, L.L.P.

(57) ABSTRACT

A glass of the present invention includes as a glass composition, in terms of mol %, 60% to 80% of $SiO_2$, 12% to 25% of $Al_2O_3$, 0% to 3% of $B_2O_3$, 0% to 3% of $Li_2O+Na_2O+K_2O$, 5% to 25% of $MgO+CaO+SrO+BaO$, and 0.1% to 10% of $P_2O_5$, and has a strain point of more than 730° C.

7 Claims, No Drawings

GLASS

TECHNICAL FIELD

The present invention relates to a glass having high heat resistance, and for example, to a glass is used for a substrate for forming a semiconductor crystal for an LED at high temperature.

BACKGROUND ART

It has been known that a semiconductor crystal to be used in an LED or the like is improved in semiconductor characteristics through its forming into a film at higher temperature.

In such application, a sapphire substrate having high heat resistance is generally used. Also in other applications, the sapphire substrate is used when the semiconductor crystal is formed into a film at high temperature (e.g., 700° C. or more).

CITATION LIST

Patent Literature 1: JP 11-243229 A

SUMMARY OF INVENTION

Technical Problem

Meanwhile, in recent years, a technology for forming the semiconductor crystal into a large-area film has been actively investigated. The technology is considered to also provide a promising surface-emitting light source for a large display.

However, the sapphire substrate is unsuitable for the above-mentioned application because it is difficult to increase the area of the sapphire substrate.

When a glass is used instead of sapphire, it is considered that an increase in area of a substrate can be achieved. However, a conventional glass substrate is liable to be thermally deformed through heat treatment at high temperature owing to insufficient heat resistance.

In addition, a glass having high heat resistance is difficult to form into a glass substrate having a flat sheet shape owing to insufficient devitrification resistance.

The present invention has been made in view of the above-mentioned circumstances, and a technical object of the present invention is to devise a glass having high heat resistance and capable of being formed into a flat sheet shape.

Solution to Problem

The inventors of the present invention have repeatedly performed various experiments. As a result, the inventors have found that the technical object can be achieved by restricting a glass composition and glass characteristics within predetermined ranges. Thus, the inventors propose the finding as the present invention. That is, according to one embodiment of the present invention, there is provided a glass, comprising as a glass composition, in terms of mol %, 60%, to 80% of $SiO_2$, 12% to 25% of $Al_2O_3$, 0% to 3% of $B_2O_3$, 0% to 3% of $Li_2O+Na_2O+K_2O$, 5% to 25% of $MgO+CaO+SrO+BaO$, and 0.1% to 10% of $P_2O_5$, and having a strain point of more than 730° C. Herein, the content of "$Li_2O+Na_2O+K_2O$" refers to the total content of $Li_2O$, $Na_2O$, and $K_2O$. The content of "$MgO+CaO+SrO+BaO$" refers to the total content of MgO, CaO, SrO, and BaO. The "strain point" refers to a value measured in accordance with a method of ASTM C336.

In the glass according to the embodiment of the present invention, the content of $Al_2O_3$ is restricted to 12 mol % or more, the content of $B_2O_3$ is restricted to 3 mol % or less, and the content of $Li_2O+Na_2O+K_2O$ is restricted to 3 mol % or less in the glass composition. With this, the strain point is remarkably increased, and hence the heat resistance of a glass substrate can be significantly increased.

In addition, the glass according to the embodiment of the present invention comprises 5 mol % to 25 mol % of $MgO+CaO+SrO+BaO$ and 0.1 mol % to 10 mol % of $P_2O_5$ in the glass composition. With this, devitrification resistance can be increased while the heat resistance is maintained.

Secondly, it is preferred that the glass according to the embodiment of the present invention have a content of $B_2O_3$ of less than 1 mol %.

Thirdly, if is preferred that the glass according to the embodiment of the present invention have a content of $Li_2O+Na_2O+K_2O$ of 0.2 mol % or less.

Fourthly, it is preferred that the glass according to the embodiment of the present invention have a molar ratio $(MgO+CaO+SrO+BaO)/Al_2O_3$ of from 0.5 to 3. Herein, the "molar ratio $(MgO+CaO+SrO+BaO)/Al_2O_3$" refers to a value obtained by dividing the total content of MgO, CaO, SrO, and BaO by the content of $Al_2O_3$.

Fifthly, it is preferred that the glass according to the embodiment of the present invention have a strain point of 760° C. or more.

Sixthly, it is preferred that the glass according to the embodiment of the present invention have a difference of (a temperature at a viscosity at high temperature of $10^{2.5}$ dPa·s-strain point) or 980° C. or less. Herein, the "temperature at a viscosity at high temperature of $10^{2.5}$ dPa·s" refers to a value measured by a platinum sphere pull up method.

Seventhly, it is preferred that the glass according to the embodiment of the present invention have a temperature at a viscosity at high temperature of $10^{2.5}$ dPa·s of 1,750° C. or less, Eighthly, it is preferred that the glass according to the embodiment of the present invention have a flat sheet shape.

Ninthly, it is preferred that the glass according to the embodiment of the present invention be used for a substrate for forming a semiconductor crystal.

DESCRIPTION OF EMBODIMENTS

A glass of the present invention comprises as a glass composition, in terms of mol %, 60% to 80% of $SiO_2$, 12% to 25% of $Al_2O_3$, 0% to 3% of $B_2O_3$, 0% to 3% of $Li_2O+Na_2O+K_2O$, 5% to 25% of $MgO+CaO+SrO+BaO$, and 0.1% to 10% of $P_2O_5$, and has a strain point of more than 730° C. The reasons why the contents of the components are restricted as described above are hereinafter described. The expression "%" refers to "mol %" in the descriptions of the components.

The lower limit of the content range of $SiO_2$ is preferably 60% or more, 63% or more, 65% or more, or 67% or more, particularly preferably 68% or more, and the upper limit of the content range of $SiO_2$ is preferably 80% or less, 75% or less, or 73% or less, particularly preferably 71% or less. When the content of $SiO_2$ is too small, a devitrified crystal containing $Al_2O_3$ is liable to be generated, and the strain point is liable to lower. Meanwhile, when the content of $SiO_2$ is too large, a viscosity at high temperature increases, and thus meltability is liable to lower. Further, a devitrified crystal containing $SiO_2$ is liable to be generated.

The lower limit of the content range of $Al_2O_3$ is preferably 12% or more or 13% or more, particularly preferably 14% or more, and the upper limit of the content range of $Al_2O_3$ is preferably 25% or less, 20% or less, or 18% or less, particularly preferably 17% or less. When the content of $Al_2O_3$ is too small, the strain point is liable to lower. Meanwhile, when the content of $Al_2O_3$ is too large, the devitrified crystal containing $Al_2O_3$ is liable to be generated.

The upper limit of the content range of $B_2O_3$ is preferably 3% or less, 1% or less, less than 1%, or 0.5% or less, particularly preferably 0.1% or less. When the content of $B_2O_3$ is too large, there is a risk in that the strain point may significantly lower.

The upper limit of the content range of $Li_2O+Na_2O+K_2O$ is preferably 3% or less, 1% or less, less than 1%, or 0.5% or less, particularly preferably 0.2% or less. When the content of $Li_2O+Na_2O+K_2O$ is too large, an alkali ion is diffused into a semiconductor substance, and thus the characteristics of a semiconductor are liable to deteriorate. The upper limit of the content range of each of $Li_2O$, $Na_2O$, and $K_2O$ is preferably 3% or less, 1% or less, less than 1%, 0.5% or less, or 0.3% or less, particularly preferably 0.2% or less. Each of $Li_2O$, $Na_2O$, and $K_2O$ is a component which is inevitably mixed in as a raw material impurity. In consideration of raw material cost, the content of $Li_2O+Na_2O+K_2O$ is restricted to preferably 0.01% or more, particularly preferably 0.02% or more.

The lower limit of the content range of $MgO+CaO+SrO+BaO$ is preferably 5% or more, 7% or more, 8% or more, 10% or more, or 12% or more, particularly preferably 14% or more, and the upper limit of the content range of $MgO+CaO+SrO+BaO$ is preferably 25% or less, 20% or less, or 18% or less, particularly preferably 17% or less. When the content of $MgO+CaO+SrO+BaO$ is too small, a liquidus temperature significantly increases, and thus a denitrified crystal is liable to be generated in the glass. Meanwhile, when the content of $MgO+CaO+SrO+BaO$ is too large, the strain point is liable to lower.

When both an increase in strain point and an improvement in meltability are to be achieved, the lower limit of the range of the molar ratio $(MgO+CaO+SrO+BaO)/Al_2O_3$ is preferably 0.5 or more, 0.6 or more, 0.7 or more, or 0.8 or more, particularly preferably 0.9 or more, and the upper limit of the range of the molar ratio $(MgO+CaO+SrO+BaO)/Al_2O_3$ is preferably 3 or less, 2 or less, 1.5 or less, 1.2 or less, or 1.1 or less.

The lower limit of the content range of MgO is preferably 0% or more, 1% or more, or 2% or more, particularly preferably 3% or more, and the upper limit of the content range of MgO is preferably 10% or less, 9% or less, or 8% or less, particularly preferably 7% or less. When the content of MgO is too small, the meltability and a Young's modulus are liable to lower. Meanwhile, when the content of MgO is too large, generation of the devitrified crystal containing $Al_2O_3$ (in particular, mullite) is accelerated, with the result that a liquidus viscosity lowers. Further, the strain point is liable to lower, MgO has an increasing effect on a thermal expansion coefficient so that the thermal expansion coefficient matches the thermal expansion coefficient of a material to be formed into a film, while the effect is the lowest among those of alkaline earth metal oxides.

The lower limit of the content range of CaO is preferably 0% or more, 3% or more, 5% or more, or 7% or more, particularly preferably 9% or more, and the upper limit of the content range of CaO is preferably 25% or less or 20% or less, particularly preferably 15% or less. When the content of CaO is too small, the meltability is liable to lower. Meanwhile, when the content of CaO is too large, the liquidus temperature increases, and thus the devitrified crystal is liable to be generated in the glass.

CaO has high effects of improving the liquidus viscosity and increasing the meltability without lowering the strain point as compared to other alkaline earth metal oxides. In addition, CaO has a higher increasing effect on the thermal expansion coefficient than MgO. Therefore, it is preferred to preferentially introduce CaO among the alkaline earth metal oxides. The lower limit of the range of the molar ratio $CaO/(MgO+CaO+SrO+BaO)$ is preferably 0.5 or more, 0.6 or more, 0.7 or more, or 0.8 or more, particularly preferably 0.9 or more. The "molar ratio $CaO/(MgO+CaO+SrO+BaO)$" refers to a value obtained by dividing the content of CaO by the total content of MgO, CaO, SrO, and BaO.

The lower limit of the content range of SrO is preferably 0% or more, 2% or more, or 4% or more, particularly preferably 6% or more, and the upper limit of the content range of SrO is preferably 15% or less or 12% or less, particularly preferably 10% or less. When the content of SrO is too small, the strain point is liable to lower. Meanwhile, when the content of SrO is too large, the liquidus temperature increases, and thus the devitrified crystal is liable to be generated in the glass. In addition, the suitability is liable to lower. SrO has a higher increasing effect on the thermal expansion coefficient than MgO and CaO.

The lower limit of the content range of BaO is preferably 0% or more, 0.1% or more, 1% or more, 3% or more, or 5% or more, particularly preferably 7% or more, and the upper limit of the content range of BaO is preferably 20% or less, 17% or less, 14% or less, or 12% or less, particularly preferably 10% or less. When the content of BaO is too small, the strain point and the thermal expansion coefficient are liable to lower. Meanwhile, when the content of BaO is too large, the liquidus temperature increases, and thus the devitrified crystal is liable to be generated in the glass. In addition, the melt ability is liable to lower. BaO has the highest increasing effects on the thermal expansion coefficient and the strain point among the alkaline earth metal oxides.

The lower limit of the content range of $P_2O_5$ is preferably 0.1% or more, 1% or more, 2% or more, or 3% or more, particularly preferably 4% or more, and the upper limit of the content range of $P_2O_5$ is preferably 10% or less or 8% or less, particularly preferably 6% or less. $P_2O_5$ is effective in suppressing precipitation of a devitrified crystal containing an alkaline earth metal element, and further, is more effective in suppressing a reduction in strain point than the alkaline earth metal oxides. Meanwhile, when $P_2O_5$ is excessively introduced, the glass is liable to be phase separated, and a devitrified crystal free from the alkaline earth metal element is liable to precipitate.

In order to achieve an increase in strain point, the content of $P_2O_5$ is preferably larger than the content of $B_2O_3$, more preferably larger than the content of $B_2O_3$ by 1% or more, still more preferably larger than the content of $B_2O_3$ by 3% or more.

In order to achieve both a reduction in electrical resistivity of molten glass and an increase in strain point, the molar ratio $(Li_2O+Na_2O+K_2O)/P_2O_5$ is preferably from 0.001 to 0.05, particularly preferably from 0.01 to 0.03. The "molar ratio $(Li_2O+Na_2O+K_2O)/P_2O_5$" refers to a value obtained by dividing the total content of $Li_2O$, $Na_2O$, and $K_2O$ by the content of $P_2O_5$.

In order to achieve an increase in devitrification resistance, the content of $P_2O_5$ is preferably larger than the content of MgO, more preferably larger than the content of MgO by 1% or more, still more preferably larger than the content of MgO by 3% or more.

In order to achieve an increase in devitrification resistance, the content of $P_2O_5$ is preferably larger than the content of SrO, more preferably larger than the content of SrO by 1% or more, still more preferably larger than the content of SrO by 3% or more.

Other than the above-mentioned components, the following components may be introduced in the glass composition.

ZnO is a component which increases the meltability. However, when ZnO is contained in a large amount in the glass composition, the glass is liable to devitrify, and the strain point is liable to lower. Therefore, the content of ZnO is preferably from 0% to 5%, front 0% to 3%, from 0% to 0.5%, or from 0% to 0.3%, particularly preferably from 0% to 0.1%.

$ZrO_2$ is a component which increases the Young's modulus. The content of $ZrO_2$ is preferably from 0% to 5%, from 0% to 3%, from 0% to 0.5%, or from 0% to 0.2%, particularly preferably from 0% to 0.02%. When the content of $ZrO_2$ is too large, the liquidus temperature increases, and thus a devitrified crystal of zircon is liable to precipitate.

$TiO_2$ is a component which lowers the viscosity at high temperature and thus increases the meltability, and is also a component which suppresses solarisation. However, when $TiO_2$ is contained in a large amount in the glass composition, the glass is liable to be colored. Therefore, the content of $TiO_2$ is preferably from 0% to 5%, from 0% to 3%, from 0% to 1%, or from 0% to 0.1%, particularly preferably from 0% to 0.02%.

$SnO_2$ is a component which has a satisfactory fining effect in a high temperature region, and is also a component which lowers the viscosity at high temperature. The content of $SnO_2$ is preferably from 0% to 1%, from 0.01% to 0.5%, or from 0.01% to 0.3%, particularly preferably from 0.04% to 0.1%. When the content of $SnO_2$ is too large, a denitrified crystal of $SnO_2$ is liable to precipitate.

$CeO_2$, $SO_3$, C, and metal ponder (for example, of Al, Si, or the like) may be added at up to 1% as a fining agent as long as glass characteristics are not impaired.

Also $As_2O_3$, $Sb_2O_3$, F, and Cl act effectively as a fining agent. The glass of the present invention does not exclude the incorporation of those components, but from an environmental viewpoint, the contents of those components are each preferably less than 0.1%, particularly preferably less than 0.05%.

In the case where the content of $SnO_2$ is from 0.01% to 0.5%, the glass is liable to be colored when the content of $Rh_2O_3$ is too large. $Rh_2O_3$ may be mixed in from a manufacturing vessel made of platinum. The content of $Rh_2O_3$ is preferably from 0% to 0.0005%, particularly preferably from 0.00001% to 0.0001%.

$SO_3$ is a component which is mixed in from a raw material as an impurity. When the content of $SO_3$ is too large, bubbles called reboil are generated during melting and forming, and defects may occur in the glass. The lower limit of the content range of $SO_3$ is preferably 0.0001% or more, and the upper limit of the content range of $SO_3$ is preferably 0.005% or less, 0.003% or less, or 0.002% or less, particularly preferably 0.001% or less.

The content of a rare earth oxide is preferably less than 2%, 1% or less, or 0.5% or less, particularly preferably less than 0.1%. When the content of the rare earth oxide is too large, batch cost is liable to increase.

Iron is a component which is mixed in from the raw material as an impurity. When the content of iron is too large, a transmittance, particularly an ultraviolet light transmittance may lower. Therefore, the lower limit of the content range of iron in terms of $Fe_2O_3$ is preferably 0.001% or more, and the upper limit of the content range of iron in terms of $Fe_2O_3$ is preferably 0.05% or less, 0.04% or less, 0.03% or less, 0.02% or less, or 0.01% or less, particularly preferably less than 0.01%.

The glass of the present invention preferably has the following characteristics.

The strain point is preferably more than 730° C., 740° C. or more, 750° C. or more, 760° C. or more, 770° C. or more, 780° C. or more, or 790° C. or more, particularly preferably 800° C. or more. As the strain point becomes lower, the heat resistance is more liable to lower.

It is preferred that the thermal expansion coefficient within a temperature range of from 30° C. to 380° C. be close to the thermal expansion coefficient of a material to be formed into a film. Specifically, when a gallium nitride-based semiconductor crystal is formed into a film, the thermal expansion coefficient is preferably $40 \times 10^{-7}$/° C. or more or $42 \times 10^{-7}$/° C. or more, particularly preferably $44 \times 10^{-7}$/° C. or more. Alternatively, when a-Si, p-Si, or the like is formed into a film, the thermal expansion coefficient is desirably $30 \times 10^{-7}$/° C. or more and less than $40 \times 10^{-7}$/° C. The "thermal expansion coefficient within a temperature range of from 30° C. to 380° C." refers to an average value measured with a dilatometer.

When a glass substrate having formed thereon a semiconductor element is used for an electronic device, also the glass substrate is required to be reduced in weight, because a reduction in weight of the electronic device is important. In order to satisfy such requirement, it is desired to reduce the weight of the glass substrate through a reduction in density. The density is preferably 3.20 g/cm³ or less, 3.00 g/cm³ or less, or 2.90 g/cm³ or less, particularly preferably 2.80 g/cm³ or less.

A glass having a high strain point is generally hard to melt. Therefore, the enhancement of the meltability is an issue. When the meltability is enhanced, a defective rate attributed to bubbles, foreign matter, or the like is reduced, and hence a high-quality glass substrate can be supplied at low cost in a large number. Therefore, the temperature at a viscosity at high temperature of $10^{2.5}$ dPa·s is preferably 1,750° C. or less, 1,720° C. or less, 1,700° C. or less, or 1,680° C. or less, particularly preferably 1,670° C. or less. The temperature at a viscosity at high temperature of $10^{2.5}$ dPa·s corresponds to a melting temperature. As the temperature becomes lower, the meltability becomes more excellent.

When the glass is formed into a flat sheet shape by a down-draw method or the like, the devitrification resistance is important. In consideration of the forming temperature of the glass system according to the present invention, the liquidus temperature is preferably 1,350° C. or less, 1,300° C. or less, or 1,260° C. or less, particularly preferably 1,230° C. or less. In addition, the liquidus viscosity is preferably $10^{3.6}$ dPa·s or more, $10^{4.0}$ dPa·s or more, or $10^{4.5}$ dPa·s or more, particularly preferably $10^{5.0}$ dPa·s or more. Herein, the "liquidus temperature" refers to a value obtained by measuring a temperature at which a crystal precipitates when glass powder that passed through a standard 30-mesh sieve (500 μm) and remained on a 50-mesh sieve (300 μm) is placed in a platinum boat and kept for 24 hours in a gradient heating furnace. The "liquidus viscosity" refers to a value obtained by measuring the viscosity of the glass at the liquidus temperature by a platinum sphere pull up method.

The glass of the present invention preferably has a formed joined surface in the glass. That is, the glass of the present invention is preferably formed by an overflow down-draw method. The overflow down-draw method refers to a method in which molten glass is caused to overflow from both sides of a wedge-shaped refractory, and the overflowing molten glasses are subjected to down-draw downward at the lower end of the wedge-shaped refractory while being joined, to thereby form a glass in a flat sheet shape. By the overflow down-draw method, surfaces which are to serve as the surfaces of a glass substrate are formed in a state of free surfaces without being brought into contact with the refractory. As a result, a glass substrate having good surface quality can be produced without polishing at low cost, and an increase in area and a reduction in thickness are easily achieved as well.

In addition to the overflow down-draw method, the glass substrate may be formed by, for example, a slot down method, a redraw method, a float method, or a roll-out method.

In the glass of the present invention, the thickness (in the case of a flat sheet shape, a sheet thickness) is not particularly limited, but is preferably 1.0 mm or less, 0.7 mm or less, or 5.0 mm or less, particularly preferably 0.4 mm or less. As the sheet thickness becomes smaller, the weight of a device can be reduced more easily. The thickness may be adjusted by controlling, for example, a flow rate and a sheet-drawing speed at the time of glass production.

In the glass of the present invention, the strain point can be increased, by reducing a β-OH value. The β-OH value is preferably 0.40/mm or less, 0.35/mm or less, 0.30/mm or less, 0.25/mm or less, or 0.20/mm or less, particularly preferably 0.15/mm or less. When the β-OH value is too large, the strain point is liable to lower. When the β-OH value is too small, the meltability is liable to lower. Therefore, the β-OH value is preferably 0.01/mm or more, particularly preferably 0.05/mm or more.

A method of reducing the β-OH value is exemplified by the following methods: (1) a method involving selecting raw materials having low water contents; (2) a method involving adding a component (such as Cl or $SO_3$) that reduces the water content in the glass; (3) a method involving reducing the water content in a furnace atmosphere; (4) a method involving performing $N_2$ bubbling in the molten glass; (5) a method involving adopting a small melting furnace; (6) a method involving increasing the flow rate of the molten glass; and (7) a method involving adopting an electric melting method.

Herein, the "β-OH value" refers to a value determined by using the following equation after measuring the transmittances of the glass with an FT-IR.

β-OH value=$(1/X)\log(T_3/T_2)$

X: Glass thickness (mm)
$T_3$: Transmittance (%) at a reference wavelength of 3,846 $cm^{-1}$
$T_2$: Minimum transmittance (%) at a wavelength around a hydroxyl group absorption wavelength of 3,600 $cm^{-1}$ As a method of producing the glass of the present invention on an industrial scale, there is preferably given a method of producing a glass comprising as a glass composition, in terms of mol %, 60% to 80% of $SiO_2$, 12% to 25% of $Al_2O_3$, 0% to 3% of $B_2O_3$, 0% to 3% of $Li_2O+Na_2O+K_2O$, 5% to 25% of MgO+CaO+SrO+BaO, and 0.1% to 10% of $P_2O_5$, and having a β-OH value of 0.40/mm or less and a strain point of more than 730° C., the method comprising: a melting step of supplying a blended glass batch to a melting furnace and heating the blended glass batch through application of a current with a heating electrode to provide molten glass; and a forming step of forming the resultant molten glass into a glass in a flat sheet shape having a sheet thickness of from 0.1 mm to 0.7 mm by an overflow down-draw method.

In general, a production process for the glass substrate comprises a melting step, a fining step, a supplying step, a stirring step, and a forming step. The melting step is a step of melting a glass batch obtained by blending glass raw materials to provide molten glass. The fining step is a step of fining the molten glass obtained in the melting step by an action of a fining agent or the like. The supplying step is a step of transferring the molten glass from one step to another. The stirring step is a step of stirring the molten glass to homogenize the molten glass. The forming step is a step of forming the molten glass into a glass in a flat sheet shape. A step other than the above-mentioned steps, for example, a state adjusting step of adjusting the molten glass to be in a state suitable for forming may be introduced after the stirring step as required.

When the conventional alkali-free glass and low-alkali glass are produced on an industrial scale, the melting has been generally performed by heating with combustion burner flame. A burner is generally arranged at an upper portion of a melting kiln, and uses fossil fuel as its fuel, specifically, for example, liquid fuel, such as heavy oil, or gas fuel, such as LPG. The combustion flame may be obtained by mixing the fossil fuel and oxygen gas. However, such method is liable to entail an increase in β-OH value because a large amount of water is mixed in the molten glass during the melting. Therefore, in the production of the glass substrate of the present invention, it is preferred to perform, heating through application of a current with a heating electrode, and it is more preferred to perform the melting by only heating through application of a current with a heating electrode without heating with combustion burner flame. With this, water is less liable to be mixed in the molten glass during the melting, and hence the β-OH value is easily controlled to 0.40/mm or less, 0.30/mm or less, or 0.20/mm or less, particularly 0.15/mm or less. Further, when the heating through application of a current with a heating electrode is performed, the amount of energy required for obtaining the molten glass per unit mass is reduced, and the amount of a melt volatile is reduced. As a result, an environmental load can be reduced.

The heating through application of a current with a heating electrode is preferably performed by applying an alternating voltage to a heating electrode arranged at a bottom portion or a side portion of a melting kiln so as to be brought into contact with the molten glass in the melting kiln. A material used for the heating electrode preferably has heat resistance and corrosion resistance to the molten glass. For example, tin oxide, molybdenum, platinum, or rhodium may be used.

Each of the alkali-free glass and the low-alkali glass, which has a small content of an alkali metal oxide, has a high electrical resistivity. Therefore, when the heating through application of a current with a heating electrode is applied to such glass, there is a risk in that the current flows not only in the molten glass but also in a refractory constituting the melting kiln, with the result that the refractory constituting the melting kiln is damaged early. In order to prevent such situation, it is preferred to use, as a refractory in a furnace, a zirconia-based refractory having a high electrical resistivity, particularly zirconia electrocast bricks. In addition, it is preferred to introduce a component which lowers the electrical resistivity ($Li_2O$, $Na_2O$, $K_2O$, $Fe_2O_3$, or the like) in the molten glass (glass composition) in a small amount. In particular, it is preferred to introduce $Li_2O$, $Na_2O$, and $K_2O$ at a total content of from 0.01 mol % to 1 mol %, from 0.02 mol % to 0.5 mol %, from 0.03 mol % to 0.4 mol %, or from 0.05 mol % to 0.3 mol %, particularly from 0.07 mol % to 0.2 mol %. Further, the content of $ZrO_2$ in the zirconia-based refractory is preferably 85 mass % or more, particularly preferably 90 mass % or more. When the introduction amount of $Li_2O$, $Na_2O$, and $K_2O$ in terms of the total content is 0.2 mol % or less, there is no risk of contamination of a semiconductor substance by diffusion of an alkali ion.

EXAMPLES

The present invention is hereinafter described in detail by way of Examples. However, Examples below are merely examples. The present invention is by no means limited to Examples below.

Examples of the present invention (Sample Nos. 1 to 22) are shown in Table 1.

TABLE 1

| | | No. 1 | No. 2 | No. 3 | No. 4 | No. 5 | No. 6 | No. 7 |
|---|---|---|---|---|---|---|---|---|
| Glass composition (mol %) | $SiO_2$ | 69.9 | 69.9 | 66.9 | 63.9 | 66.9 | 63.9 | 67.9 |
| | $Al_2O_3$ | 15.0 | 15.0 | 15.0 | 15.0 | 15.0 | 15.0 | 15.0 |
| | $B_2O_3$ | 0.0 | 0.0 | 0.0 | 0.0 | 0.0 | 0.0 | 0.0 |
| | $P_2O_3$ | 3.0 | 6.0 | 3.0 | 6.0 | 3.0 | 6.0 | 2.0 |
| | $Li_2O$ | 0.0 | 0.0 | 0.0 | 0.0 | 0.0 | 0.0 | 0.0 |
| | $Na_2O$ | 0.0 | 0.0 | 0.0 | 0.0 | 0.0 | 0.0 | 0.0 |
| | $K_2O$ | 0.0 | 0.0 | 0.0 | 0.0 | 0.0 | 0.0 | 0.0 |
| | MgO | 4.0 | 3.0 | 0.0 | 0.0 | 5.0 | 5.0 | 0.0 |
| | CaO | 8.0 | 6.0 | 0.0 | 0.0 | 5.0 | 5.0 | 10.0 |
| | SrO | 0.0 | 0.0 | 7.5 | 7.5 | 5.0 | 5.0 | 0.0 |
| | BaO | 0.0 | 0.0 | 7.5 | 7.5 | 0.0 | 0.0 | 5.0 |
| | $SnO_2$ | 0.1 | 0.1 | 0.1 | 0.1 | 0.1 | 0.1 | 0.1 |
| | $Fe_2O_3$ | 0.0 | 0.0 | 0.0 | 0.0 | 0.0 | 0.0 | 0.0 |
| $Li_2O + Na_2O + K_2O$ | | 0.0 | 0.0 | 0.0 | 0.0 | 0.0 | 0.0 | 0.0 |
| MgO + CaO + SrO + BaO | | 12.0 | 9.0 | 15.0 | 15.0 | 15.0 | 15.0 | 15.0 |
| (Mg + Ca + Sr + Ba)/Al | | 0.80 | 0.60 | 1.00 | 1.00 | 1.00 | 1.00 | 1.00 |
| ρ [g/cm³] | | 2.45 | 2.38 | 2.79 | 2.76 | 2.55 | 2.53 | 2.65 |
| α [×10⁻⁷/°C.] | | 30.7 | 25.7 | 46.5 | 46.9 | 36.4 | 36.4 | 41.9 |
| Ps [°C.] | | 767 | 772 | 788 | 763 | 758 | 740 | 785 |
| Ta [°C.] | | 827 | 837 | 852 | 825 | 816 | 798 | 844 |
| Ts [°C.] | | 1.072 | 1.105 | 1.098 | 1.074 | 1.048 | 1.037 | 1.073 |
| $10^{4.0}$ dPa·s [°C.] | | 1.396 | 1.457 | 1.430 | 1.406 | 1.364 | 1.361 | 1.387 |
| $10^{3.0}$ dPa·s [°C.] | | 1.561 | 1.628 | 1.595 | 1.572 | 1.523 | 1.523 | 1.548 |
| $10^{2.5}$ dPa·s [°C.] | | 1.666 | 1.735 | 1.697 | 1.677 | 1.624 | 1.625 | 1.651 |
| TL [°C.] | | 1.362 | 1.461 | 1.328 | <1.226 | 1.271 | 1.353 | 1.289 |
| logηTL [dPa·s] | | 4.3 | 4.7 | 4.8 | >5.6 | 4.8 | 4.1 | 4.8 |
| $10^{2.5}$ dPa·s − Ps [°C.] | | 899 | 963 | 909 | 914 | 866 | 885 | 866 |
| β-OH value | | 0.15 | Not measured | Not measured | Not measured | Not measured | Not measured | Not measured |

| | | No. 8 | No. 9 | No. 10 | No. 11 | No. 12 |
|---|---|---|---|---|---|---|
| Glass composition (mol %) | $SiO_2$ | 65.9 | 69.9 | 65.9 | 66.9 | 66.9 |
| | $Al_2O_3$ | 15.0 | 15.0 | 15.0 | 15.0 | 15.0 |
| | $B_2O_3$ | 0.0 | 0.0 | 0.0 | 0.0 | 0.0 |
| | $P_2O_3$ | 4.0 | 1.0 | 4.0 | 3.0 | 3.0 |
| | $Li_2O$ | 0.0 | 0.0 | 0.0 | 0.0 | 0.0 |
| | $Na_2O$ | 0.0 | 0.0 | 0.0 | 0.0 | 0.0 |
| | $K_2O$ | 0.0 | 0.0 | 0.0 | 0.0 | 0.0 |
| | MgO | 0.0 | 0.0 | 0.0 | 0.0 | 0.0 |
| | CaO | 10.0 | 14.0 | 15.0 | 15.0 | 10.0 |
| | SrO | 0.0 | 0.0 | 0.0 | 0.0 | 0.0 |
| | BaO | 5.0 | 0.0 | 0.0 | 0.0 | 5.0 |
| | $SnO_2$ | 0.1 | 0.1 | 0.1 | 0.1 | 0.1 |
| | $Fe_2O_3$ | 0.0 | 0.0 | 0.0 | 0.0 | 0.0 |
| $Li_2O + Na_2O + K_2O$ | | 0.0 | 0.0 | 0.0 | 0.0 | 0.0 |
| MgO + CaO + SrO + BaO | | 15.0 | 14.0 | 15.0 | 15.0 | 15.0 |
| (Mg + Ca + Sr + Ba)/Al | | 1.00 | 0.93 | 1.00 | 1.00 | 1.00 |

TABLE 1-continued

|  |  |  |  |  |  |
|---|---|---|---|---|---|
| ρ [g/cm³] | 2.63 | 2.76 | 2.49 | 2.50 | 2.64 |
| α [×10⁻⁷/° C.] | 42.0 | 41.0 | 39.3 | 39.0 | 42.0 |
| Ps [° C.] | 769 | 804 | 782 | 789 | 778 |
| Ta [° C.] | 828 | 861 | 838 | 845 | 837 |
| Ts [° C.] | 1.061 | 1.079 | 1.055 | 1.059 | 1.066 |
| 10⁴·⁰ dPa·s [° C.] | 1.380 | 1.378 | 1.359 | 1.359 | 1.383 |
| 10³·⁰ dPa·s [° C.] | 1.541 | 1.537 | 1.516 | 1.513 | 1.541 |
| 10²·⁵ dPa·s [° C.] | 1.643 | 1.640 | 1.616 | 1.613 | 1.643 |
| TL [° C.] | <1.139 | 1.362 | 1.311 | 1.314 | 1.233 |
| logηTL [dPa·s] | >6.4 | 4.1 | 4.4 | 4.4 | 5.4 |
| 10²·⁵ dPa·s − Ps [° C.] | 874 | 836 | 834 | 824 | 865 |
| β-OH value | 0.09 | Not measured | Not measured | Not measured | Not measured |

|  |  | No. 13 | No. 14 | No. 15 | No. 16 | No. 17 |
|---|---|---|---|---|---|---|
| Glass composition (mol %) | SiO₂ | 65.9 | 66.9 | 66.9 | 64.9 | 68.9 |
|  | Al₂O₃ | 16.0 | 15.0 | 15.0 | 16.0 | 14.0 |
|  | B₂O₃ | 0.0 | 0.0 | 0.0 | 0.0 | 0.0 |
|  | P₂O₃ | 3.93 | 3.0 | 3.0 | 3.0 | 3.0 |
|  | Li₂O | 0.0 | 0.0 | 0.0 | 0.0 | 0.0 |
|  | Na₂O | 0.07 | 0.0 | 0.0 | 0.0 | 0.0 |
|  | K₂O | 0.0 | 0.0 | 0.0 | 0.0 | 0.0 |
|  | MgO | 0.0 | 2.0 | 0.0 | 0.0 | 0.0 |
|  | CaO | 10.0 | 10.0 | 12.0 | 11.0 | 14.0 |
|  | SrO | 0.0 | 0.0 | 0.0 | 0.0 | 0.0 |
|  | BaO | 4.0 | 3.0 | 3.0 | 5.0 | 0.0 |
|  | SnO₂ | 0.1 | 0.1 | 0.1 | 0.1 | 0.1 |
|  | Fe₂O₃ | 0.0 | 0.0 | 0.0 | 0.0 | 0.0 |
| Li₂O + Na₂O + K₂O |  | 0.0 | 0.0 | 0.0 | 0.0 | 0.0 |
| MgO + CaO + SrO + BaO |  | 14.0 | 15.0 | 15.0 | 16.0 | 14.0 |
| (Mg + Ca + Sr + Ba)/Al |  | 0.88 | 1.00 | 1.00 | 1.00 | 1.00 |
| ρ [g/cm³] |  | 2.59 | 2.58 | 2.58 | 2.66 | 2.47 |
| α [×10⁻⁷/° C.] |  | 39.8 | 38.6 | 40.8 | 43.1 | 37.9 |
| Ps [° C.] |  | 776 | 767 | 781 | 778 | 791 |
| Ta [° C.] |  | 838 | 825 | 838 | 836 | 849 |
| Ts [° C.] |  | 1.069 | 1.055 | 1.063 | 1.056 | 1.073 |
| 10⁴·⁰ dPa·s [° C.] |  | 1.384 | 1.370 | 1.372 | 1.357 | 1.385 |
| 10³·⁰ dPa·s [° C.] |  | 1.542 | 1.527 | 1.531 | 1.512 | 1.547 |
| 10²·⁵ dPa·s [° C.] |  | 1.640 | 1.627 | 1.631 | 1.609 | 1.651 |
| TL [° C.] |  | 1.195 | 1.239 | 1.285 | 1.287 | 1.343 |
| logηTL [dPa·s] |  | 5.8 | 5.2 | 4.8 | 4.6 | 4.5 |
| 10²·⁵ dPa·s − Ps [° C.] |  | 864 | 860 | 850 | 831 | 860 |
| β-OH value |  | 0.10 | Not measured | Not measured | Not measured | Not measured |

|  |  | No. 18 | No. 19 | No. 20 | No. 21 | No. 22 |
|---|---|---|---|---|---|---|
| Glass composition (mol %) | SiO₂ | 66.9 | 66.9 | 66.9 | 66.9 | 67.3 |
|  | Al₂O₃ | 15.0 | 15.0 | 15.0 | 15.0 | 13.9 |
|  | B₂O₃ | 0.0 | 0.0 | 0.0 | 0.0 | 0.0 |
|  | P₂O₃ | 3.0 | 3.0 | 3.0 | 3.0 | 1.6 |
|  | Li₂O | 0.0 | 0.0 | 0.0 | 0.0 | 0.0 |
|  | Na₂O | 0.0 | 0.0 | 0.0 | 0.0 | 0.0 |
|  | K₂O | 0.05 | 0.0 | 0.0 | 0.0 | 0.0 |
|  | MgO | 4.95 | 3.0 | 3.0 | 1.0 | 6.0 |
|  | CaO | 8.0 | 10.0 | 8.0 | 10.0 | 7.4 |
|  | SrO | 0.0 | 0.0 | 0.0 | 0.0 | 0.3 |
|  | BaO | 2.0 | 2.0 | 4.0 | 4.0 | 3.4 |
|  | SnO₂ | 0.0 | 0.0 | 0.0 | 0.0 | 0.1 |
|  | Fe₂O₃ | 0.0 | 0.0 | 0.0 | 0.0 | 0.005 |
| Li₂O + Na₂O + K₂O |  | 0.0 | 0.0 | 0.0 | 0.0 | 0.0 |
| MgO + CaO + SrO + BaO |  | 15.0 | 15.0 | 15.0 | 15.0 | 17.1 |
| (Mg + Ca + Sr + Ba)/Al |  | 1.00 | 1.00 | 1.00 | 1.00 | 0.81 |
| ρ [g/cm³] |  | 2.54 | 2.55 | 2.60 | 2.61 | 2.61 |

TABLE 1-continued

| | | | | | |
|---|---|---|---|---|---|
| α [×10$^{-7}$/° C.] | 35.6 | 37.8 | 38.7 | 40.6 | 39.1 |
| Ps [° C.] | 756 | 762 | 760 | 771 | 754 |
| Ta [° C.] | 814 | 819 | 819 | 829 | 810 |
| Ts [° C.] | 1,045 | 1,050 | 1,054 | 1,061 | 1,034 |
| 10$^{4.0}$ dPa·s [° C.] | 1.356 | 1.360 | 1.372 | 1.378 | 1.343 |
| 10$^{3.0}$ dPa·s [° C.] | 1.514 | 1.521 | 1.532 | 1.537 | 1.500 |
| 10$^{2.5}$ dPa·s [° C.] | 1.614 | 1.621 | 1.632 | 1.638 | 1.598 |
| TL [° C.] | 1.280 | 1.254 | 1.202 | 1.238 | 1.209 |
| logηTL [dPa·s] | 4.7 | 4.9 | 5.6 | 5.3 | 5.2 |
| 10$^{2.5}$ dPa·s − Ps [° C.] | 858 | 859 | 872 | 867 | 844 |
| β-OH value | 0.16 | Not measured | Not measured | Not measured | 0.09 |

Each sample was produced in the following manner. First, a glass batch prepared by blending glass raw materials so that each glass composition listed in the tables was attained was placed in a platinum crucible, and then melted at from 1,600° C. to 1,750° C. for 24 hours. When the glass batch was dissolved, molten glass was stirred to be homogenized by using a platinum stirrer. Next, the molten glass was poured on a carbon sheet and formed into a glass having a flat sheet shape. Each of the resultant samples was evaluated for its density ρ, thermal expansion coefficient α, strain point Ps, annealing point Ta, softening point Ts, temperature at a viscosity at high temperature of 10$^{4.8}$ dPa·s, temperature at a viscosity at high temperature of 10$^{3.0}$ dPa·s, temperature at a viscosity at high temperature of 10$^{2.5}$ dPa·s, liquidus temperature TL, liquidus viscosity log ηTL, and β-OH value.

The density ρ is a value obtained by measurement by a well-known Archimedes method.

The thermal expansion coefficient α is an average value measured in the temperature range of from 30° C. to 380° C. with a dilatometer.

The strain point Ps, the annealing point Ta, and the softening point Ts are values obtained by measurement in conformity with ASTM C336 or ASTM C338.

The temperature at a viscosity at high temperature of 10$^{4.0}$ dPa·s, the temperature at a viscosity at high temperature of 10$^{3.0}$ dPa·s, and the temperature at a viscosity at high temperature of 10$^{2.5}$ dPa·s are values obtained by measurement by a platinum sphere pull up method.

The liquidus temperature TL is a temperature at which devitrification (a devitrified crystal) was observed in the glass when each of the samples was pulverized, and glass powder that passed through a standard 30-mesh sieve (500 μm) and remained on a 50-mesh sieve (300 μm) was placed in a platinum boat and kept for 24 hours in a gradient heating furnace, followed by taking the platinum boat out of the gradient heating furnace. The liquidus viscosity log ηTL is a value obtained by measuring the viscosity of the glass at the liquidus temperature TL by a platinum sphere pull up method.

The β-OH value is a value calculated by using the above-mentioned equation.

As is apparent from Table 1, each of Sample Nos. 1 to 22 has high heat resistance, and has devitrification resistance enough to be formed into a flat sheet shape. Therefore, each of Sample Nos. 1 to 22 is considered to be suitable as a glass substrate for forming a semiconductor crystal for an LED at high temperature.

INDUSTRIAL APPLICABILITY

The glass of the present invention has high heat resistance, and has devitrification resistance enough to be formed into a flat sheet shape. Therefore, the glass of the present invention is suitable for a glass substrate for forming a semiconductor crystal for an LED at high temperature. Further, other than the above-mentioned applications, the glass of the present, invention is also suitable for a substrate for a display of a liquid crystal display or the like, particularly for a substrate for a display driven by an LTPS or oxide TFT.

The invention claimed is:

1. A glass, comprising as a glass composition, in terms of mol %, 60% to 80% of $SiO_2$, 12% to 25% of $Al_2O_3$, 0% to less than 1% of $B_2O_3$, 0% to 3% of $Li_2O+Na_2O+K_2O$, 8% to 25% of $MgO+CaO+SrO+BaO$, 0.1% to 10% of $P_2O_5$, 0.1% to 20% of BaO, and 0.01% to 1% of $SnO_2$, and having a strain point of more than 730° C., wherein the glass has a molar ratio $(MgO+CaO+SrO+BaO)/Al_2O_3$ of from 0.7 to 1.

2. The glass according to claim 1, wherein the glass has a content of $Li_2O+Na_2O+K_2O$ of 0.2 mol % or less.

3. The glass according to claim 1, wherein the glass has a strain point of 760° C. or more.

4. The glass according to claim 1, wherein the glass has a difference of (a temperature at a viscosity at high temperature of 10$^{2.5}$ dPa·s-strain point) of 980° C. or less.

5. The glass according to claim 1, wherein the glass has a temperature at a viscosity at high temperature of 10$^{2.5}$ dPa·s of 1,750° C. or less.

6. The glass according to claim 1, wherein the glass has a flat sheet shape.

7. The glass according to claim 1, wherein the glass is used for a substrate for forming a semiconductor crystal.

* * * * *